US012774517B2

(12) United States Patent
Wu et al.

(10) Patent No.: US 12,774,517 B2
(45) Date of Patent: Oct. 27, 2026

(54) DIFFUSION BONDED TUNGSTEN CONTAINING TARGET TO COPPER ALLOY BACKING PLATE

(71) Applicant: Honeywell International Inc., Charlotte, NC (US)

(72) Inventors: Xiaodan Wu, Spokane, WA (US); Susan D. Strothers, Mead, WA (US); Rashmi Mohanty, Liberty Lake, WA (US); Wayne Meyer, Cheney, WA (US)

(73) Assignee: Solstice Advanced Materials US, Inc., Morris Plains, NJ (US)

( * ) Notice: Subject to any disclaimer, the term of this patent is extended or adjusted under 35 U.S.C. 154(b) by 0 days.

(21) Appl. No.: 18/531,641

(22) Filed: Dec. 6, 2023

(65) Prior Publication Data

US 2024/0229225 A1 Jul. 11, 2024

Related U.S. Application Data

(60) Provisional application No. 63/437,378, filed on Jan. 6, 2023.

(51) Int. Cl.
*C23C 14/34* (2006.01)
*C22C 27/04* (2006.01)

(52) U.S. Cl.
CPC .......... *C23C 14/3414* (2013.01); *C22C 27/04* (2013.01)

(58) Field of Classification Search
CPC .. C23C 14/3414; C23C 14/3407; C22C 27/04
See application file for complete search history.

(56) References Cited

U.S. PATENT DOCUMENTS 4,586,063 A * 4/1986 Nakamura ............ H01L 29/475 438/572
5,693,203 A * 12/1997 Ohhashi .............. H01J 37/3435 428/673

(Continued)

FOREIGN PATENT DOCUMENTS

CN 102554455 A 7/2012
CN 103274715 A 9/2013

(Continued)

OTHER PUBLICATIONS

The Engineering Toolbox, "Metals—Temperature Expansion Coefficients", 2005, https://www.engineeringtoolbox.com/thermal-expansion-metals-d_859.html (Accessed Sep. 27, 2024) (Year: 2005).*

(Continued)

*Primary Examiner* — Patrick S Ott
(74) *Attorney, Agent, or Firm* — Faegre Drinker Biddle & Reath LLP

(57) ABSTRACT

A sputtering target assembly comprises a tungsten containing sputtering target, a copper alloy backing plate attached to the tungsten containing sputtering target, and an interlayer positioned between and diffusion bonding the tungsten containing sputtering target and copper alloy backing plate. The tungsten containing sputtering target comprises 0 wt. % to about 50 wt. % of an alloying component and the balance is tungsten. The alloying component is titanium, aluminum or molybdenum. A method of making is also provided.

19 Claims, 4 Drawing Sheets

(56) References Cited

U.S. PATENT DOCUMENTS

| | | | | |
|---|---|---|---|---|
| 5,799,860 | A | 9/1998 | Demaray et al. | |
| 5,913,100 | A * | 6/1999 | Kohsaka | C22C 27/04 257/E21.582 |
| 6,071,389 | A | 6/2000 | Zhang | |
| 6,089,444 | A * | 7/2000 | Slattery | B32B 15/01 228/198 |
| 6,579,431 | B1 | 6/2003 | Bolcavage et al. | |
| 6,619,537 | B1 | 9/2003 | Zhang et al. | |
| 2002/0112791 | A1 | 8/2002 | Kardokus et al. | |
| 2002/0185372 | A1 | 12/2002 | Hunt et al. | |
| 2003/0134143 | A1 | 7/2003 | Oda et al. | |
| 2004/0020769 | A1 | 2/2004 | Ivannov et al. | |
| 2004/0079634 | A1 | 4/2004 | Wickersham et al. | |
| 2004/0134776 | A1 | 7/2004 | Misner et al. | |
| 2004/0159545 | A1 | 8/2004 | Michaluk | |
| 2004/0256226 | A1 | 12/2004 | Wickersham | |
| 2005/0011749 | A1 | 1/2005 | Kachalov et al. | |
| 2005/0051606 | A1 | 3/2005 | Perrot et al. | |
| 2006/0065517 | A1 | 3/2006 | Ivanov et al. | |
| 2008/0149477 | A1* | 6/2008 | Lo | C23C 14/3414 266/274 |
| 2008/0197017 | A1 | 8/2008 | Yi et al. | |
| 2008/0236738 | A1 | 10/2008 | Lo et al. | |
| 2009/0078570 | A1* | 3/2009 | Yi | C23C 14/3414 228/208 |
| 2009/0229975 | A1 | 9/2009 | Yamakoshi | |
| 2010/0012488 | A1 | 1/2010 | Koenigsmann et al. | |
| 2010/0038241 | A1 | 2/2010 | Ivanov | |
| 2012/0228131 | A1 | 9/2012 | Lo et al. | |
| 2014/0024150 | A1* | 1/2014 | Matsumura | H01L 33/40 438/22 |
| 2015/0170889 | A1 | 6/2015 | Sarkar et al. | |
| 2017/0287685 | A1* | 10/2017 | Ferrasse | C23C 24/106 |
| 2018/0340254 | A1 | 11/2018 | Polcik et al. | |

FOREIGN PATENT DOCUMENTS

| | | | |
|---|---|---|---|
| CN | 104259644 | A | 1/2015 |
| CN | 104741773 | A | 7/2015 |
| CN | 104741774 | A | 7/2015 |
| CN | 105174990 | A | 12/2015 |
| CN | 105798409 | A | 7/2016 |
| CN | 107663631 | A | 2/2018 |
| CN | 110414131 | A | 11/2019 |
| CN | 111014930 | A | 4/2020 |
| CN | 111843161 | A | 10/2020 |
| CN | 112122764 | A | 12/2020 |
| CN | 112935511 | A | 6/2021 |
| CN | 112935512 | A | 6/2021 |
| CN | 113305412 | A | 8/2021 |
| CN | 214921358 | U | 11/2021 |
| CN | 115255606 | A | 11/2022 |
| EP | 0761372 | A1 | 3/1997 |
| EP | 1147241 | A1 | 10/2001 |
| EP | 1194607 | A2 | 4/2002 |
| EP | 1349698 | A1 | 10/2003 |
| EP | 1392883 | A1 | 3/2004 |
| EP | 1392884 | A1 | 3/2004 |
| EP | 1513963 | A1 | 3/2005 |
| EP | 1556526 | A2 | 7/2005 |
| EP | 1594998 | A2 | 11/2005 |
| EP | 1639620 | A2 | 3/2006 |
| EP | 1670967 | A1 | 6/2006 |
| EP | 2044611 | A2 | 4/2009 |
| EP | 2111478 | A2 | 10/2009 |
| EP | 2119808 | A1 | 11/2009 |
| EP | 2145976 | A1 | 1/2010 |
| EP | 2152927 | A2 | 2/2010 |
| EP | 2213763 | A2 | 8/2010 |
| EP | 3080330 | A1 | 10/2016 |
| EP | 3251145 | A1 | 12/2017 |
| EP | 3436618 | A1 | 2/2019 |
| JP | 2002-129316 | A | 5/2002 |
| JP | 2022-058160 | A | 4/2022 |
| WO | 00/06793 | A1 | 2/2000 |
| WO | 00/40770 | A1 | 7/2000 |
| WO | 00/73531 | A1 | 12/2000 |
| WO | 02/47865 | A1 | 6/2002 |
| WO | 02/86181 | A2 | 10/2002 |
| WO | 2004/024972 | A2 | 3/2004 |
| WO | 2004/031436 | A1 | 4/2004 |
| WO | 2004/076706 | A2 | 9/2004 |
| WO | 2007/038651 | A1 | 4/2007 |
| WO | 2008/005461 | A2 | 1/2008 |
| WO | 2012/112376 | A1 | 8/2012 |
| WO | 2013/122927 | A1 | 8/2013 |
| WO | 2017/070479 | A1 | 4/2017 |
| WO | 2017/115648 | A1 | 7/2017 |
| WO | 2022/070878 | A1 | 4/2022 |
| WO | 2022/070880 | A1 | 4/2022 |
| WO | 2022/070881 | A1 | 4/2022 |

OTHER PUBLICATIONS

International Search Report and Written Opinion received for PCT Patent Application No. PCT/US2023/086440, mailed on Apr. 30, 2024, 11 pages.

* cited by examiner

DIFFUSION BONDED TUNGSTEN CONTAINING TARGET TO COPPER ALLOY BACKING PLATE

CROSS-REFERENCE TO RELATED APPLICATION

This application claims priority to U.S. Provisional Patent Application No. 63/437,378, filed Jan. 6, 2023, which is herein incorporated by reference in its entirety.

TECHNICAL FIELD

The present disclosure relates to sputtering target assemblies and components for use with sputtering targets in physical vapor deposition systems.

BACKGROUND

Physical vapor deposition methodologies are used extensively for forming thin films of material over a variety of substrates. One area of importance for such deposition technology is semiconductor fabrication. A diagrammatic view of a portion of an exemplary physical vapor deposition ("PVD") apparatus 8 is shown in FIG. 1. In one configuration, a sputtering target assembly 10 comprises a backing plate 12 having a target 14 bonded thereto. A substrate 18 such as a semiconductive material wafer is within the PVD apparatus 8 and provided to be spaced from the target 14. A surface 16 of target 14 is a sputtering surface. As shown, the target 14 is disposed above the substrate 18 and is positioned such that sputtering surface 16 faces substrate 18. In operation, sputtered material 22 is displaced from the sputtering surface 16 of target 14 and used to form a coating (or thin film) 20 over substrate 18. In some embodiments, suitable substrates 18 include wafers used in semiconductor fabrication.

In an exemplary PVD process, the target 14 is bombarded with energy until atoms from the sputtering surface 16 are released into the surrounding atmosphere and subsequently deposit on substrate 18. In one exemplary use, plasma sputtering is used to deposit a thin metal film onto chips or wafers for use in electronics.

The target 14 is formed from the metal or metal alloy intended to be deposited as a film onto a surface. During the PVD process, metal atoms are removed from the surface of the sputtering target and are deposited onto the substrate 18.

The backing plate 12 may be used to support the target 14 during the PVD deposition process. A PVD deposition process may cause undesirable physical changes to a sputtering target assembly 10 including the target 14 and backing plate 12. For example, the PVD deposition process may include high temperatures which would cause the target 14 to warp or deform. To prevent this, the sputtering target assembly 10 and components may be designed to reduce these undesirable physical changes. For example, the backing plate 12 may be constructed to have a high heat capacity and/or heat conductivity, which can minimize or prevent undesirable physical changes to the target 14 and sputtering target assembly 10.

In an example two-component sputtering target assembly 10 design, as illustrated in FIG. 2, a backing plate 12 is formed as a separate component from the target 14. The backing plate 12 as shown is a single solid plate. The target 14 is joined to the backing plate 12 by techniques such as fastening, welding, soldering and diffusion bonding to form a sputtering target assembly 10. The backing plate 12 provides a variety of functions that include strengthening of mechanical properties and enhancement of physical properties of the whole sputtering target assembly 10. The sputtering target assembly 10 as shown in FIG. 2 includes the target 14 and the backing plate 12 after the two have been joined.

One method of joining a target 14 to a backing plate 12 is by diffusion bonding the two components together. In diffusion bonded targets, bonding of some target and backing plate materials is difficult because of the large difference in the coefficient of thermal expansion (CTE) between the target material and backing plate material. For example, in diffusion bonded targets, bonding some target materials, for example tungsten, to conventional backing plate materials such as aluminum, aluminum alloy, copper, or copper alloy backing plates is difficult because of the large difference in the CTE between these materials.

If an object is made by joining together two bodies of metals having a difference in the CTE, de-bonding or even cracking may occur when the object is heated, for example during bonding or when use in a high temperature environment such as PVD. As an example, when creating a sputtering target assembly 10 as in FIG. 2, thermal stresses can build up at the interface 24 after bonding the target 14 to the backing plate 12 during the cooling phase when the materials are physically connected by a solid state bond but contract at a different rate.

Generally thermal stress in a system having multiple materials is proportional to the difference in CTE between the materials in the system. The relationship between thermal stress ($\sigma$), as a function of temperature change ($\Delta T$), and the value of the difference in CTE ($\Delta CTE$, also called CTE mismatch) can be shown using equation 1:

$$\sigma \sim \Delta CTE * \Delta T \qquad \text{Equation 1}$$

What is needed is a method for bonding a tungsten containing target to a backing plate which is an improvement over the foregoing.

SUMMARY

Embodiment 1 is a sputtering target assembly comprising a tungsten containing sputtering target, a copper alloy backing plate attached to the tungsten containing sputtering target, and an interlayer positioned between and diffusion bonding the tungsten containing sputtering target and copper alloy backing plate. The tungsten containing sputtering target comprises 0 wt. % to about 50 wt. % of an alloying component and the balance is tungsten. The alloying component is selected from the group consisting of titanium, aluminum and molybdenum. The interlayer comprises an adhesion layer immediately adjacent to the tungsten containing sputtering target, a first copper layer immediately adjacent to the adhesion layer, and a second copper layer immediately adjacent to the first copper layer and the copper alloy backing plate. The second copper layer has a thickness of about 0.1 inches to about 0.3 inches.

Embodiment 2 is the sputtering target assembly of Embodiment 1 wherein the alloying component is titanium and the tungsten containing sputtering target comprises titanium in an amount from about 1 wt. % to about 30 wt. % and the balance is tungsten.

Embodiment 3 is the sputtering target assembly of Embodiment 1 wherein the alloying component is titanium and the tungsten containing sputtering target comprises titanium in an amount from about 3 wt. % to about 15 wt. % and the balance is tungsten.

Embodiment 4 is the sputtering target assembly of Embodiment 1 wherein the tungsten containing sputtering target comprises 100 wt. % tungsten.

Embodiment 5 is the sputtering target assembly of Embodiment 1 wherein the alloying component is aluminum and the tungsten containing sputtering target comprises aluminum in an amount from about 0.1 wt. % to about 5 wt. % and the balance is tungsten.

Embodiment 6 is the sputtering target assembly of Embodiment 1 wherein the alloying component is molybdenum and the tungsten containing sputtering target comprises molybdenum in an amount from about 1 wt. % to about 50 wt. % and the balance is tungsten.

Embodiment 7 is the sputtering target assembly of any one of E Embodiments 1-6 wherein the tungsten containing sputtering target as a purity of at least 3N.

Embodiment 8 is the sputtering target assembly of any one of Embodiments 1-7 wherein the copper alloy backing plate is formed from a copper zinc alloy, a copper chromium alloy or a copper chromium nickel silicon alloy.

Embodiment 9 is the sputtering target assembly of any one of Embodiments 1-7 wherein the copper alloy backing plate is formed from C46400, C18200 or C18000.

Embodiment 10 is the sputtering target assembly of any one of Embodiments 1-7 wherein the copper alloy backing plate has a coefficient of thermal expansion (CTE) from about $17\times10^{-6}$ m/m° C. to about $22\times10^{-6}$ m/m° C.

Embodiment 11 is the sputtering target assembly of any one of Embodiments 1-10 wherein the tungsten containing sputtering target has a coefficient of thermal expansion (CTE) from about $4.5\times10^{-6}$ m/m° C. to about $8\times10^{-6}$ m/m° C.

Embodiment 12 is the sputtering target assembly of any one of Embodiments 1-11 wherein the bond formed by the interlayer is at least about 98% as determined with C-Scan.

Embodiment 13 is the sputtering target assembly of any one of Embodiments 1-12 wherein the average bond strength is at least about 10 ksi (68.9 MPa).

Embodiment 14 is a method for forming a sputtering target assembly, the method comprising forming an adhesion layer on a back surface of a tungsten containing target, forming a first copper layer on the adhesion layer and diffusion bonding, the first copper layer immediately adjacent to the adhesion layer, and diffusion bonding the tungsten containing sputtering target to a copper alloy backing plate by forming a second copper layer between the first copper layer and the copper alloy backing plate and diffusion bonding. The tungsten containing target comprises 0 wt. % to about 50 wt. % of an alloying component and the balance tungsten. The alloying component is selected from the group consisting of titanium, aluminum and molybdenum. The second copper layer having a thickness of about 0.1 inches to about 0.3 inches.

Embodiment 15 is the method of Embodiment 14 wherein the alloying component is tungsten and the tungsten containing sputtering target comprises titanium in an amount from about 1 wt. % to about 30 wt. % and the balance is tungsten.

Embodiment 16 is the method of Embodiment 14 wherein the tungsten containing sputtering target comprises 100 wt. % tungsten.

Embodiment 17 is the method of Embodiment 14 wherein the alloying component is molybdenum and the tungsten containing sputtering target comprises molybdenum in an amount from about 1 wt. % to about 50 wt. % and the balance is tungsten.

Embodiment 18 is the method of any one of Embodiments 14-17 wherein the copper alloy backing plate is formed from a copper zinc alloy, a copper chromium alloy or a copper chromium nickel silicon alloy.

Embodiment 19 is the method of any one of Embodiments 14-18 wherein diffusion bonding the tungsten containing sputtering target to a copper alloy backing plate is performed by hot isostatic pressing (HIP) at about 300° C. to about 400° C. and a pressure equal to or greater than about 15 ksi.

Embodiment 20 is the method of any of Embodiments 14-19 wherein forming an adhesion layer includes forming an adhesion layer of less than about 10 microns by electroplating.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Disclosed herein is an improved sputtering target assembly containing a tungsten containing sputtering target and a copper alloy backing plate and a method of making the same. The tungsten containing sputtering target and the copper alloy backing plate have significantly different CTEs. This difference produces great thermal stress during cooling, for example, cooling following the bonding process, which can lead to either debonding or cracking of the tungsten containing sputtering target.

Figure 1:
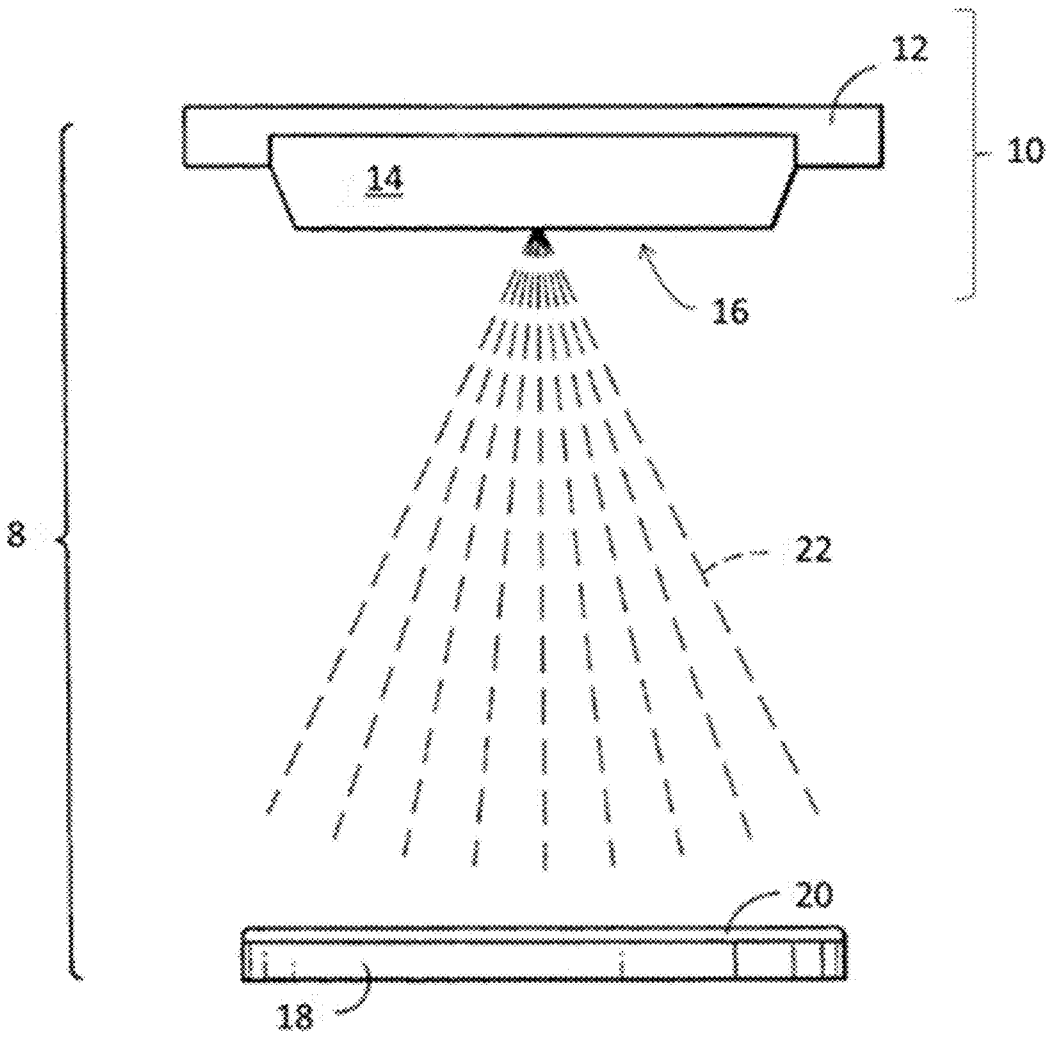
FIG. 1 is a schematic illustration of a sputtering apparatus.
Figure 2:
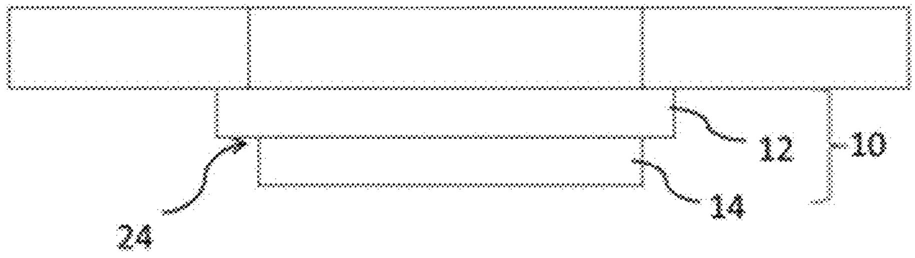
FIG. 2 is a schematic illustration of a sputtering target assembly.
Figure 3:
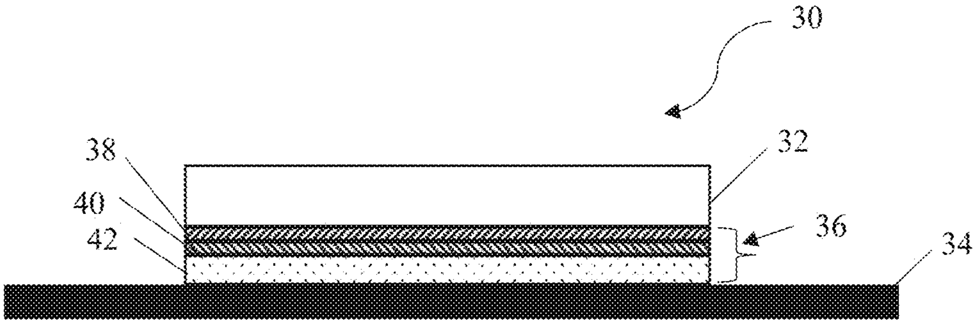
FIG. 3 is a schematic illustration of a sputtering target assembly according to some embodiments of the invention.

FIG. 3 is a schematic cross-sectional view of sputtering target assembly 30 which includes tungsten containing sputtering target 32, copper alloy backing plate 34 and interlayer 36. The interlayer 36 is positioned between tungsten containing sputtering target 32 and copper alloy backing plate 34 and joins the components to one another.

Tungsten containing sputtering target 32 includes tungsten as a major component, optionally one or more alloying components selected from the group consisting of titanium, molybdenum and aluminum, and inevitable impurities. In some embodiments, tungsten containing sputtering target 32 consists of or consists essentially of tungsten and 0 wt. % to 50 wt. % of one or more alloying components. In some embodiments, tungsten containing sputtering target 32 is formed from 100% high purity tungsten. That is, tungsten containing sputtering target 32 consists of tungsten with inevitable impurities and is not a tungsten alloy. In other embodiments, tungsten containing sputtering target 32 is formed from a tungsten alloy, such as a tungsten-titanium alloy, a tungsten-molybdenum alloy or a tungsten-aluminum alloy. In some embodiments, tungsten containing sputtering target 32 has a coefficient of thermal expansion (CTE) from about $4.5\times10^{-6}$ m/m° C. to about $8\times10^{-6}$ m/m° C. or a CTE from about $4.5\times10^{-6}$ m/m° C. to about $5.5\times10^{-6}$ m/m° C.

In some embodiments, the alloying component is titanium. In some embodiments, titanium is present in the tungsten containing sputtering target 32 in an amount from about 1 wt. % to about 30 wt. % based on the total weight of the sputtering target 32. In other embodiments, titanium is present in the tungsten containing sputtering target 32 in an amount from about 1 wt. % to about 20 wt. % or from about 3 wt. % to about 15 wt. % based on the total weight of the sputtering target.

Tungsten is a major component in the tungsten containing sputtering target 32. That is, tungsten is present in the tungsten containing sputtering target 32 at an amount greater than any other component. In some embodiments, tungsten containing sputtering target 32 consists essentially of or consists of titanium and the balance is tungsten. In one embodiment, the sputtering target 32 contains about 10% by weight titanium and the balance is tungsten.

In some embodiments, tungsten is the major component in the tungsten containing sputtering target 32 and molybdenum comprises the balance. For example, molybdenum can be present in an amount from about 1 wt. % to about 50 wt. %, or from about 20 wt. % to about 40 wt. %, or from about 25 wt. % to about 35 wt. % based on the weight of the sputtering target. In some embodiments, tungsten containing sputtering target 32 consists essentially of or consists of molybdenum and the balance is tungsten.

In some embodiments, tungsten is the major component in the tungsten containing sputtering target 32 and aluminum comprises the balance. For example, aluminum can be present in an amount from about 0.1 wt. % to about 5 wt. % aluminum, or from about 0.1 wt. % to about 1 wt. % based on the weight of the sputtering target 32.

Copper alloy backing plate 34 is connected to tungsten containing sputtering target 32. Copper alloy backing plate 34. In some embodiments, copper alloy backing plate 34 is formed from a copper zinc alloy, a copper chromium alloy or a copper chromium nickel silicon alloy. For example, copper alloy backing plate 34 may be formed from C46400 (a CuZn alloy), C18200 (a Cu-1% Cr alloy) or C18000 (a CuCrNiSi alloy). In some embodiments, copper alloy backing plate 34 is a CuZn alloy. In some embodiments, copper alloy backing plate 34 has a CTE from about $17\times10^{-6}$ m/m° C. to about $22\times10^{-6}$ m/m° C. In comparison, tungsten has a CTE of $4.5\times10^{-6}$ m/m° C. Based on the rule of mixtures, a tungsten-titanium alloy containing 1 wt. % to 30 wt. % titanium has a CTE of 4.6 to $8\times10^{-6}$ m/m° C., a tungsten-aluminum alloy containing 0.1 wt. % to 5 wt. % aluminum has a CTE of 4.5 to $5.5\times10^{-6}$ m/m° C., and a tungsten-molybdenum containing 1 wt. % to 50 wt. % molybdenum has a CTE of 4.5 to $5\times10^{-6}$ m/m° C.

One skilled in the art will recognize that tungsten containing sputtering target 32 will also include inevitable impurities. In some embodiments, tungsten containing sputtering target 32 is a high purity target having a purity of at least 3N (99.9%), or at least 4N (99.99%), or at least 5N (99.999%). In some embodiments, tungsten containing sputtering target 32 has a purity of 5N.

Interlayer 36 attaches tungsten containing sputtering target 32 to copper alloy backing plate 34. Interlayer 36 includes adhesion layer 38, first copper layer 40 and second copper layer 42. Adhesion layer 38 is directly adjacent to tungsten containing sputtering target 32. Adhesion layer 38 is attached to the back surface of tungsten containing sputtering target 32 and opposite the sputtering surface. Adhesion layer 38 can be formed from any metal suitable for attachment to first copper layer 40. For example, adhesion layer 38 can be formed from nickel or titanium. In some embodiments, adhesion layer 38 can consist or consist essentially of nickel and impurities. In other embodiments, adhesion layer 38 can consist of or consist essentially of titanium. Adhesion layer 38 is a thin layer. For example, adhesion layer 38 can have a thickness from about 1 to about 10 microns. Adhesion layer 38 is an adhesion layer for the first copper layer 40.

First copper layer 40 is directly adjacent to adhesion layer 38. First copper layer 40 is diffusion bonded to adhesion layer 38. First copper layer 40 can be formed of an oxygen-free copper, such as Cu-OFE (oxygen fee electronic grade). In some embodiments, first copper layer 40 is formed of copper that is oxygen-free up to 99.99%. First copper layer 40 is a thin layer. For example, first copper layer 40 can have a thickness from about 0.010 to about 0.100 inches (about 0.254 mm to about 2.54 mm).

Second copper layer 42 is directly adjacent to copper alloy backing plate 34 and first copper layer 40. Second copper layer 42 is diffusion bonded to the copper alloy backing plate 34 and tungsten containing sputtering target 32 having adhesion layer 38 and first copper layer 40. Second copper layer 42 can be a soft metal. In some embodiments, second copper layer 42 can be formed of an oxygen-free copper, such as Cu-OFE. In some embodiments, first copper layer 40 is formed of copper that is oxygen-free up to 99.99%. In some embodiments, second copper layer 42 has a thickness from about 0.1 inches to about 0.3 inches (about 2.5 mm to about 7.62 mm).

Figure 4:
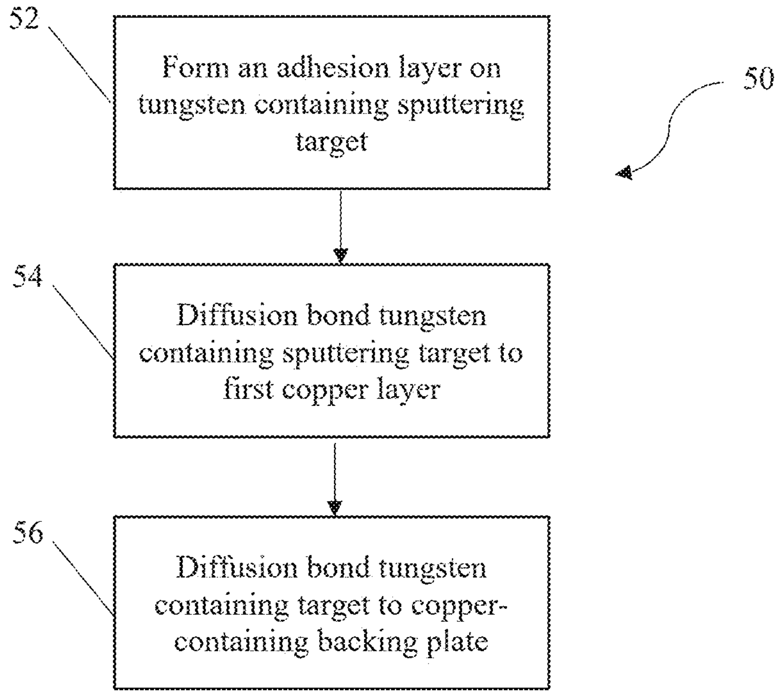
FIG. 4 is a process diagram of one method for making a sputtering target assembly.

FIG. 4 illustrates method 50 for making sputtering target assembly 30. Method 50 includes plating an adhesion layer on a tungsten containing sputtering target (step 52), diffusion bonding the tungsten containing sputtering target to a first copper layer (step 54) and diffusion bonding the tungsten containing sputtering target to a copper alloy backing plate (step 56).

In step 52, a thin layer of adhesion metal, such as nickel or titanium, is formed onto the surface of a tungsten containing sputtering target. This forms adhesion layer 38 on tungsten containing sputtering target 32 shown in FIG. 3. In some embodiments, the adhesion layer can be formed by electroplating, PVD process or ion plating. In some embodiments, the adhesion layer can be about 1 to about 10 microns thick.

In step 54, the tungsten containing sputtering target with the adhesion layer is joined to a first copper layer by diffusion bonding. This forms first copper layer 40 on adhesion layer 38 of FIG. 3. In some embodiments, the first copper layer is an oxygen-free copper foil. The copper layer can be joined to the tungsten containing sputtering target and adhesion layer by hot pressing the components at about 700° C. to about 1000° C. or at about 800° C. to about 1000° C. The first copper layer provides a bonding surface to the second copper layer. The copper of the first copper layer and the copper of the second copper layer provides a copper-to-copper bond for the assembly.

In Step 56, the tungsten containing sputtering target with the adhesion layer and the first copper layer is joined to a copper alloy backing plate by diffusion bonding. In Step 56, a second copper layer is placed immediately adjacent to the first copper layer on the tungsten containing sputtering target and a copper alloy backing plate is placed immediately adjacent to the second copper layer. This assembly is bonded by hot isostatic pressing (HIP) to form sputtering target assembly 30 of FIG. 3.

In some embodiments, the HIP process is conducted at about 300° C. to about 400° C. After the bonding process, the assembly is allowed to cool to room temperature. The low temperature of the HIP process minimizes the thermal stress between the tungsten containing sputtering target and the copper alloy backing plate during the cooling down period after the HIP.

In some embodiments, the HIP process can be conducted at a pressure of about 15 kilopounds per square inch (ksi) or greater (about 103 megapascals (MPa) or greater). For example, the HIP process can be conducted at a pressure of about 15 ksi to about 30 ksi (about 103 MPa to about 207 MPa). In some embodiments the pressure can be from about 20 ksi to about 30 ksi (about 138 MPa to about 207 MPa).

One skilled in the art will recognize that additional steps can be performed before, after or between the steps presented in FIG. 4. For example, the tungsten containing sputtering target may be machined after step 54 and before step 56. The sputtering target assembly can also be machined and/or cleaned after step 56.

C-Scan imaging can be used to assess the bond between the tungsten containing sputtering target 32 and the copper alloy backing plate 34. In some embodiments, the percent bond is at least about 98%. In some embodiments, the percent bond is at least about 99.9%.

The bond between tungsten containing sputtering target 32 and copper alloy backing plate 34 is of sufficient strength to withstand a PVD process. In some embodiments, the average bond strength is at least about 10 ksi (68.9 MPa). The average bond strength can be determined using a ram tensile test method as described in Zatorski, Z. (2007) Evaluation of Steel Clad Plate Weldability Using Ram Tensile Test Method. *Engineering Transactions,* 55(3), 229-238.

It is difficult to join a tungsten containing sputtering target to a copper alloy backing plate because of the large difference in CTEs. Prior methods resulted in de-bonding and/or the sputtering target cracking. Thermal stress is caused by the different in length change (as shown by the difference in CTE) between the sputtering target and backing plate as the materials cool down after bonding. Method 50 provides a sputtering target assembly 30 in which the tungsten containing sputtering target 32 does not de-bond from the copper alloy backing plate 34. Additionally, the tungsten containing sputtering target 32 does not experience cracking.

In some embodiments, after the tungsten containing sputtering target is joined to the backing plate for example by HIP, the target assembly has a low crown, which is a measurement of the flatness of the sputtering target. A target assembly having a low crown makes subsequent machining easier. A target assembly having a large crown may be flattened with mechanical means in an attempt to reduce the crown. However, this may result in the sputtering target or sputtering target assembly cracking. The low or small crown of the certain sputtering assemblies following HIP (without further processing) provides an improved assembly. In some embodiments, a target assembly having a tungsten-titanium sputtering target and a CuZn backing plate has a crown of less than 0.05 inches.

As used herein the term "about" means ±10%, ±5% or ±1%.

EXAMPLES

The following non-limiting Examples illustrate various features and characteristics of the present invention, which is not to be construed as limited thereto and wherein all percentages are weight percentages unless otherwise indicated.

Example 1: W10Ti Diffusion Bonded to CuZn Backing Plate

A tungsten containing sputtering target containing 10 wt. % titanium and the balance tungsten (W10Ti) was diffusion bonded to a backing plate formed from C46400 (50 wt. % copper, 39 wt. % zinc and 0.8 wt. % tin) (CuZn).

First, nickel was electroplated on the back surface of the W10Ti sputtering target to form an adhesion layer. The adhesion layer was less than about 10 microns thick.

Next, a copper layer was formed on the adhesion layer by diffusion bonding a OFE copper foil to the nickel using a hot press at about 800° C. to about 1000° C.

A sputtering target assembly was created by stacking the CuZn backing plate, a layer of OFE copper and the W10Ti sputtering target having the nickel and copper layers. This sputtering target assembly was bonding with HIP at 300° C. to about 400° C. and 25.5 kilopounds per square inch (ksi.) (175.8 megapascals (MPa)).

The resulting sputtering target assembly did not experience de-bonding or cracking of the sputtering target. The percent bond as determined by C-Scan was 99.9%. The average bond strength was measured according to Zatorski, Z. (2007) Evaluation of Steel Clad Plate Weldability Using Ram Tensile Test Method. *Engineering Transactions,* 55(3), 229-238. The average bond strength (e.g., the bond between the sputtering target and the backing plate) was 13.5 ksi (93.1 MPa). The dial test indicator was used to measure the crown of the sputtering target multiple locations at the center, mid-radius, and the edge of the target surface. The maximum crown was less than 0.04 inches (1.01 mm).

Example 2: W Diffusion Bounded to CuZn Backing Plate

A pure tungsten (100 wt. % tungsten with inevitable impurities) was diffusion bonded to a backing plate formed from C46400 (50 wt. % copper, 39 wt. % zinc and 0.8 wt. % tin) (CuZn).

First, nickel was electroplated on the back surface of the W sputtering target to form an adhesion layer. The adhesion layer was less than about 10 microns thick.

Next, a copper layer was formed on the adhesion layer by diffusion bonding a OFE copper foil to the nickel using a hot press at about 800° C. to about 1000° C.

A sputtering target assembly was created by stacking the CuZn backing plate, a layer of OFE copper and the W sputtering target having the nickel and copper layers. This sputtering target assembly was bonding with HIP at 300° C. to about 400° C. and 25.5 ksi (175.8 MPa).

The resulting sputtering target assembly did not experience de-bonding or cracking of the sputtering target. The percent bond as determined by C-Scan was 99.98%. The average bond strength was measured according to Zatorski, Z. (2007) Evaluation of Steel Clad Plate Weldability Using Ram Tensile Test Method. *Engineering Transactions,* 55(3), 229-238. The average bond strength was over 10 ksi (68.9 MPa).

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above-described features.

What is claimed is:

1. A sputtering target assembly comprising:

a tungsten containing sputtering target, wherein the tungsten containing sputtering target comprises 0 wt. % to about 50 wt. % of an alloying component and the balance is tungsten, wherein the alloying component is selected from the group consisting of titanium, aluminum and molybdenum;

a copper alloy backing plate attached to the tungsten containing sputtering target; and an interlayer positioned between and diffusion bonding the tungsten containing sputtering target and copper alloy backing plate, the interlayer comprising:

an adhesion layer immediately adjacent to the tungsten containing sputtering target;

a first copper layer immediately adjacent to the adhesion layer, the first copper layer having a thickness of 0.01 inches to 0.1 inches; and a second copper layer immediately adjacent to the first copper layer and the copper alloy backing plate, the second copper layer having a thickness of about 0.1 inches to about 0.3 inches, wherein the diffusion bond has an average bond strength of at least about 10 ksi (68.9 MPa).

2. The sputtering target assembly of claim 1 wherein the alloying component is titanium and the tungsten containing sputtering target comprises titanium in an amount from about 1 wt. % to about 30 wt. % and the balance is tungsten.

3. The sputtering target assembly of claim 1 wherein the alloying component is titanium and the tungsten containing sputtering target comprises titanium in an amount from about 3 wt. % to about 15 wt. % and the balance is tungsten.

4. The sputtering target assembly of claim 1 wherein the tungsten containing sputtering target comprises 100 wt. % tungsten.

5. The sputtering target assembly of claim 1 wherein the alloying component is aluminum and the tungsten containing sputtering target comprises aluminum in an amount from about 0.1 wt. % to about 5 wt. % and the balance is tungsten.

6. The sputtering target assembly of claim 1 wherein the alloying component is molybdenum and the tungsten containing sputtering target comprises molybdenum in an amount from about 1 wt. % to about 50 wt. % and the balance is tungsten.

7. The sputtering target assembly of claim 1 wherein the tungsten containing sputtering target has a purity of at least 3N.

8. The sputtering target assembly of claim 1 wherein the copper alloy backing plate is formed from a copper zinc alloy, a copper chromium alloy or a copper chromium nickel silicon alloy.

9. The sputtering target assembly of claim 1 wherein the copper alloy backing plate is formed from C46400, C18200 or C18000.

10. The sputtering target assembly of claim 1 wherein the copper alloy backing plate has a coefficient of thermal expansion (CTE) from about $17\times10^{-6}$ m/m° C. to about $22\times10^{-6}$ m/m° C.

11. The sputtering target assembly of claim 1 wherein the tungsten containing sputtering target has a coefficient of thermal expansion (CTE) from about $4.5\times10^{-6}$ m/m° C. to about $8\times10^{-6}$ m/m° C.

12. The sputtering target assembly of claim 1 wherein a percent bond formed by the interlayer is at least about 98% as determined with C-Scan.

13. A method for forming a sputtering target assembly, the method comprising:

forming an adhesion layer on a back surface of a tungsten containing target, the tungsten containing target comprising 0 wt. % to about 50 wt. % of an alloying component and the balance tungsten, the alloying component is selected from the group consisting of titanium, aluminum and molybdenum;

forming a first copper layer on the adhesion layer and diffusion bonding, the first copper layer immediately adjacent to the adhesion layer and the first copper layer having a thickness of 0.01 inches to 0.1 inches; and diffusion bonding the tungsten containing sputtering target to a copper alloy backing plate by forming a second copper layer between the first copper layer and the copper alloy backing plate and diffusion bonding, the second copper layer having a thickness of about 0.1 inches to about 0.3 inches, wherein the diffusion bond between the tungsten containing sputtering target and the copper alloy backing plate has an average bond strength of at least about 10 ksi (68.9 MPa).

14. The method of claim 13 wherein the alloying component is titanium, and the tungsten containing sputtering target comprises titanium in an amount from about 1 wt. % to about 30 wt. % and the balance is tungsten.

15. The method of claim 13 wherein the tungsten containing sputtering target comprises 100 wt. % tungsten.

16. The method of claim 13 wherein the alloying component is molybdenum and the tungsten containing sputtering target comprises molybdenum in an amount from about 1 wt. % to about 50 wt. % and the balance is tungsten.

17. The method of claim 13 wherein the copper alloy backing plate is formed from a copper zinc alloy, a copper chromium alloy or a copper chromium nickel silicon alloy.

18. The method of claim 13 wherein diffusion bonding the tungsten containing sputtering target to the copper alloy backing plate comprises hot isostatic pressing (HIP) at about 300° C. to about 400° C. and a pressure equal to or greater than about 15 ksi.

19. The method of claim 13 wherein forming the adhesion layer includes forming the adhesion layer of less than about 10 microns by electroplating.

* * * * *